US008618849B2

(12) United States Patent
Ju et al.

(10) Patent No.: US 8,618,849 B2
(45) Date of Patent: Dec. 31, 2013

(54) DIGITAL POWER ON RESET CONTROLLER

(71) Applicant: Broadcom Corporation, Irvine, CA (US)

(72) Inventors: Jiunn-Ming Ju, Hsin Chu (TW); Cheng-Liang Hou, Jhu-Bei (TW)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/760,888

(22) Filed: Feb. 6, 2013

(65) Prior Publication Data
US 2013/0207697 A1 Aug. 15, 2013

Related U.S. Application Data

(63) Continuation of application No. 11/132,280, filed on May 19, 2005, now Pat. No. 8,395,426.

(51) Int. Cl.
H03L 7/00 (2006.01)
(52) U.S. Cl.
USPC .......................................... 327/143
(58) Field of Classification Search
None
See application file for complete search history.

(56) References Cited

U.S. PATENT DOCUMENTS

| 5,376,834 | A | * | 12/1994 | Carobolante | 327/143 |
|---|---|---|---|---|---|
| 5,691,659 | A | | 11/1997 | Riley | |
| 6,737,884 | B2 | | 5/2004 | Shigemasa et al. | |
| 6,854,067 | B1 | | 2/2005 | Kutz et al. | |
| 6,956,414 | B2 | * | 10/2005 | Sweet | 327/142 |
| 7,243,117 | B2 | | 7/2007 | Yamamoto et al. | |
| 7,403,051 | B1 | * | 7/2008 | Lesea | 327/143 |
| 2005/0193045 | A1 | * | 9/2005 | Yamamoto et al. | 708/250 |
| 2006/0119384 | A1 | * | 6/2006 | Camarota et al. | 326/38 |

* cited by examiner

Primary Examiner — Lincoln Donovan
Assistant Examiner — Khareem E Almo
(74) Attorney, Agent, or Firm — McDermott Will & Emery LLP

(57) ABSTRACT

A digital power-on reset circuit for an electronic device includes at least one reset register and a comparator circuit. The power-on reset circuit is incorporated into the electronic device and the comparator circuit is configured to compare values in the at least one reset register with at least one predetermined value when a power-on reset state is determined and generate a reset signal when the values do not match the at least one predetermined value.

20 Claims, 8 Drawing Sheets

DIGITAL POWER ON RESET CONTROLLER

CROSS-REFERENCE TO RELATED APPLICATION

This application is a continuation of, and claims priority under 35 U.S.C. §120 to, application Ser. No. 11/132,280, filed on May 19, 2005, now issued as U.S. Pat. No. 8,395,426. The subject matter of this earlier filed application is hereby incorporated by reference.

BACKGROUND OF THE INVENTION

1. Field of the Invention

The present invention relates to a power-on reset used in restoring a storage device, register, or memory to a predetermined state when power is applied. The present invention further relates to digital power-on reset 'simplifying operation of the device.

2. Description of the Related Art

A power-on reset is used in restoring a storage device, register, or memory to a predetermined state when power is applied. A power-on reset circuit is a necessary circuit for most systems to have. A system generates power-on reset signals to. reset all subsystems and to make sure all things are initialized properly. All subsystems, including chips, rely on an external reset signal to reset the chips. In the prior art systems, a dedicated analog circuit is used to generate the reset signal.

The power-on reset circuit detects the power-on condition, and outputs reset signals to reset other circuits. The reset circuit is responsible for generating enough reset time. The output reset signal may last for a sufficient period to make sure all components are properly reset.

FIG. 1 illustrates the behavior of the chip after power-on. When power-on occurs, step 101, the chip detects the reset signal, step 102. If the reset signal is keeping on, the chip will always be in a reset state, step 103. After the reset signal is off, the chip will start chip initialization, step 104, and get into service when initialization is done, in step 105. The power-on reset event should occur only once after power-on.

FIG. 2 illustrates a traditional wire connection between a reset circuit 201 and chips 202. For the reset circuit 201, after the power is on, the reset circuit 201 will detect the condition, and generate a reset cycle to all chips 202. The quality of a reset signal is very important. The reset signal has to be most nearly a square wave. Any instability may cause the system to become locked up. Such instabilities, such as a glitch, will improperly reset the chip.

FIG. 3 illustrates a simple power-on reset circuit. It is an analog circuit and relies on a capacitor C to detect the power-on condition. After the power is on, the capacitor C is not charged, and its voltage is zero. The power VCC will charge the capacitor C through resistor R. Before the capacitor C is fully charged, the circuit has enough time to reset other components 301. A length of the reset time is based on a value of resistor R and capacitor C, i.e. the RC pair. And after capacitor C is fully charged, the reset cycle is also finish. This makes sure the power-on reset event only occur once. The circuit or similar ones are widely used to perform the power-on function, and such a circuit is not costly. Since the output of RC pair is not a perfect square wave, a filter, like a Schmitt trigger, is also integrated into the circuit.

The general flow of a power-on process is illustrated in FIG. 4. In step 401, the power-on event occurs and a reset signal is generated, in step 402. Thereafter, the reset is complete, in step 403, and the process ends.

However, there are drawbacks in the approach. The power-on reset circuit is an analog type circuit, and is not able to be built in digital chip. It can only be installed outside the chips that need to be reset. The chips that need to be reset require a dedicated input pin to get the reset status. The quality of the reset signal is also of concern, since a glitch or any unstable voltage is not permitted. However, the usage of filter can improve the quality of this voltage in the prior art. Thus, there is a need for an improved power-on reset circuit that does not have at least some of the drawbacks discussed above.

BRIEF DESCRIPTION OF THE DRAWINGS

The accompanying drawings, which are included to provide a further understanding of the invention and are incorporated in and constitute a part of this specification, illustrate embodiments of the invention that together with the description serve to explain the principles of the invention, wherein.

DETAILED DESCRIPTION OF PREFERRED EMBODIMENTS

Reference will now be made to the preferred embodiments of the present invention, examples of which are illustrated in the accompanying drawings.

Figure 1:
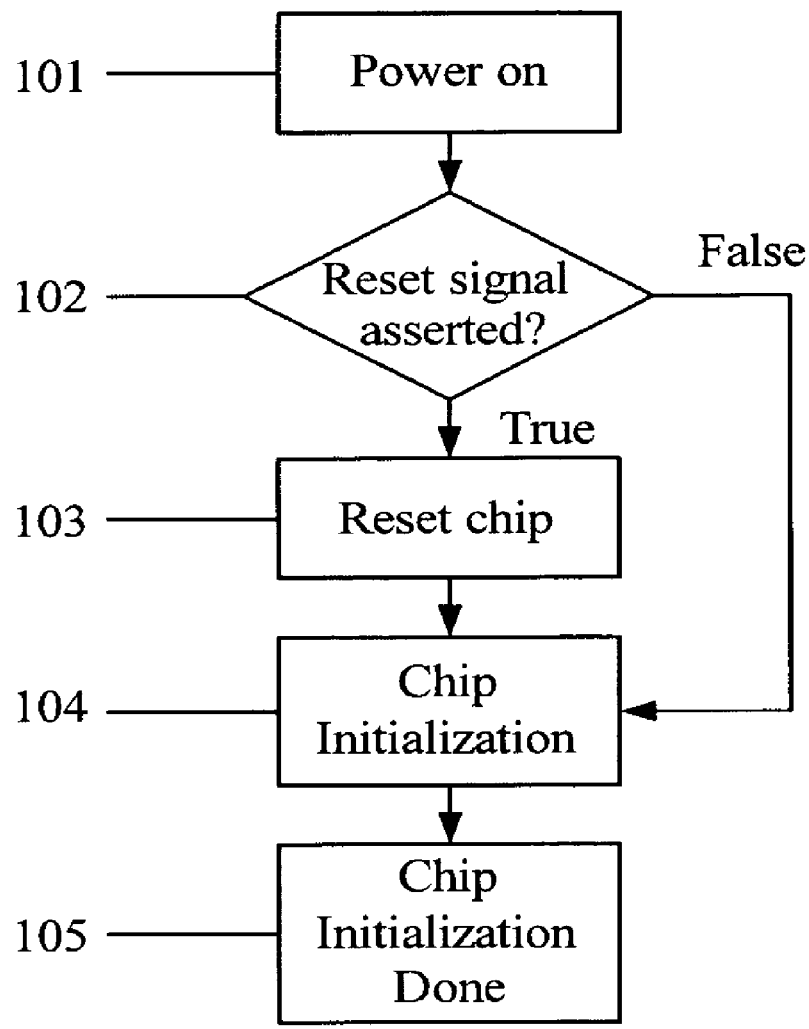
FIG. 1 illustrates a process of resetting and initializing a chip.
Figure 2:
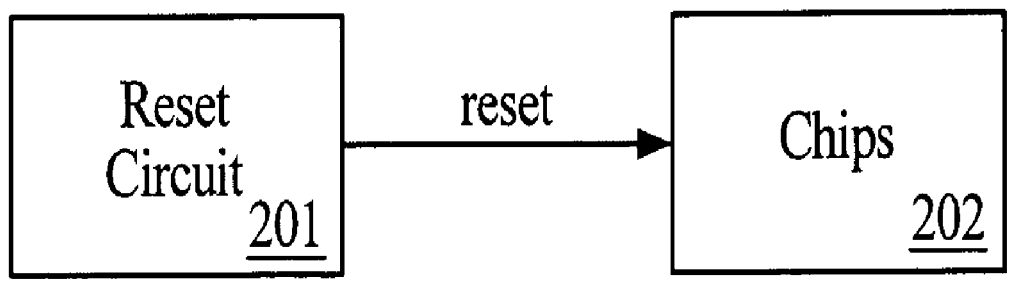
FIG. 2 illustrates a connection between a reset circuit and chips that receive a reset signal.
Figure 3:
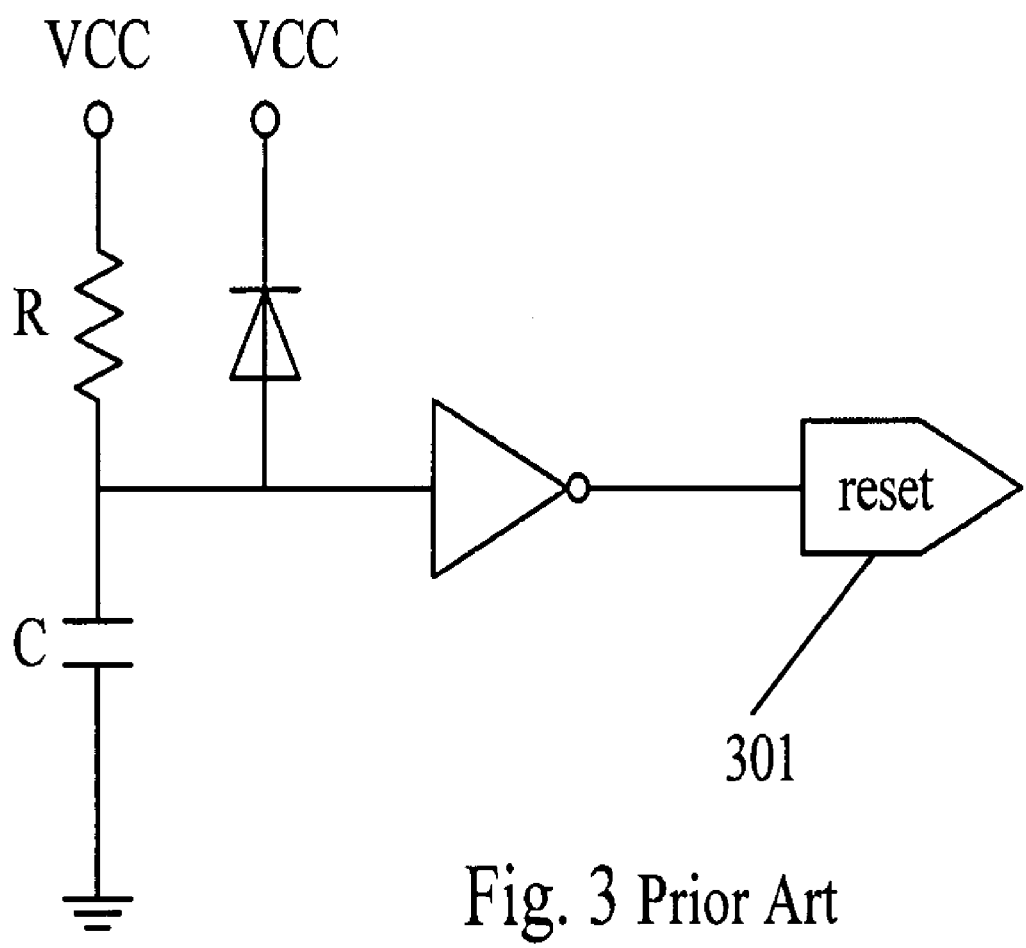
FIG. 3 illustrates a schematic of a power-on reset circuit.
Figure 4:
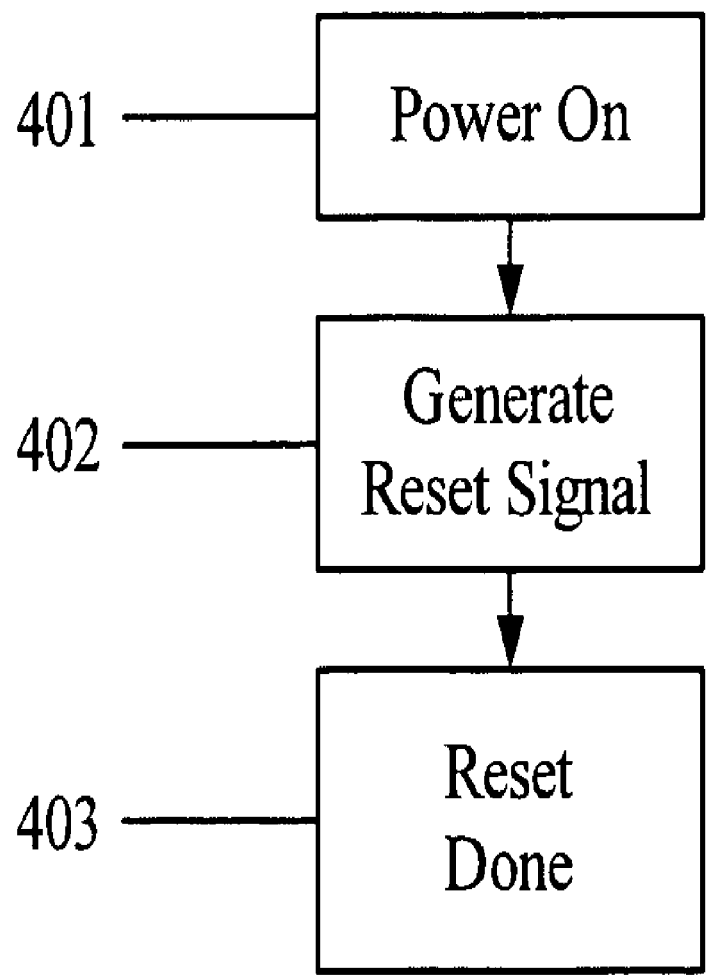
FIG. 4 illustrates a process of powering on and generating the reset signal.
Figure 5A:
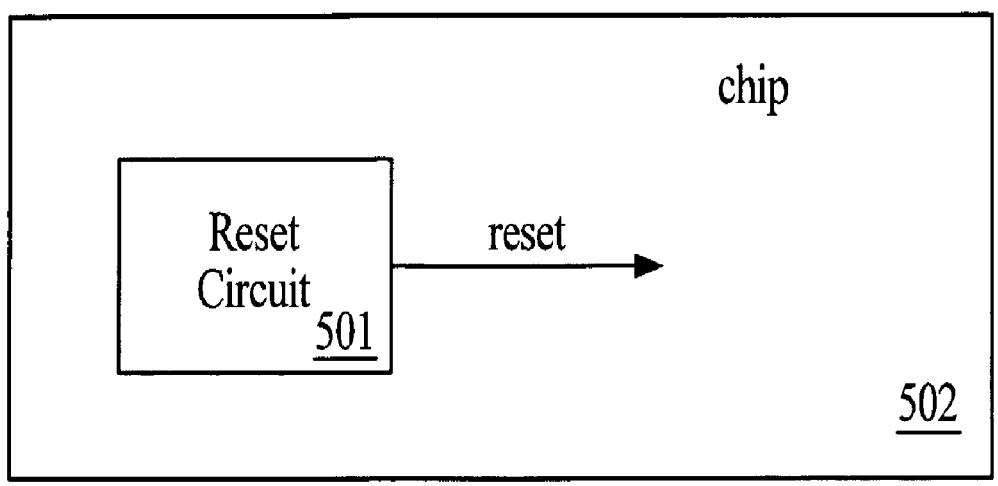
FIGS. 5A and 5B illustrate a reset circuit within a chip, according to one embodiment of the present invention.
Figure 5B:
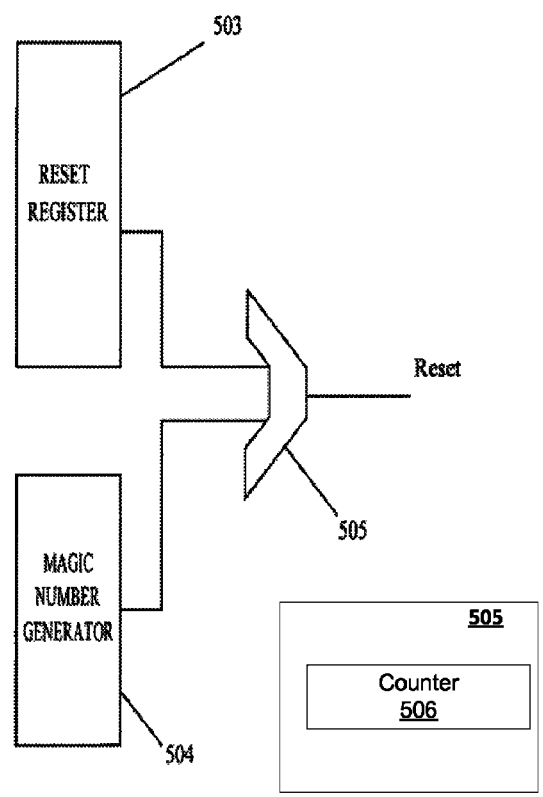

The present invention proposes an alternative solution to the prior art external power-on reset circuits. By using a digital circuit, namely a digital power on reset controller 501, it can perform the same functions. As illustrated in FIG. 5, the reset circuit 501 can be built in a digital chip 502 easily. It can detect if the chip has been reset or not after power-on. If the chip 502 has not been reset after power on, the reset circuit 501 then generates the reset signal internally to reset the chip 502. Only digital components are used to construct the reset circuit 501. Since only digital components are required, the reset circuit 501 can be integrated into digital chips, and, thus, no external reset pin is need in this embodiment.

Since, according to this embodiment, no external pin is required, there is no problem with the reset signal quality, as with the analog circuits discussed above. Since the circuit is pure digital, a near perfect reset signal can be generated.

The approach uses a set of registers called reset registers. The reset registers do not have any reset input. After power is on, the value of reset registers is supposed to be unknown. The value of the reset registers may be 0, 1, 2, or any random number. If the value of reset registers is compared to a magic number, like 0x55, 0xAA, or any unique number, the result should be not equal.

Since the comparison of the reset register with the magic number is not equal right after power on, the reset circuit 501 will begin to initialize the reset registers with the unique magic number, thereby avoiding the reset circuit 501 from detecting the power-on event again. Then, the circuit generates the reset signal. Using a counter 506, the length of reset time is easily controlled. Since logic gates and registers can implement the approach, the generated reset signal is pure digital. It is easy to guarantee the quality of the signal.

Figure 6:
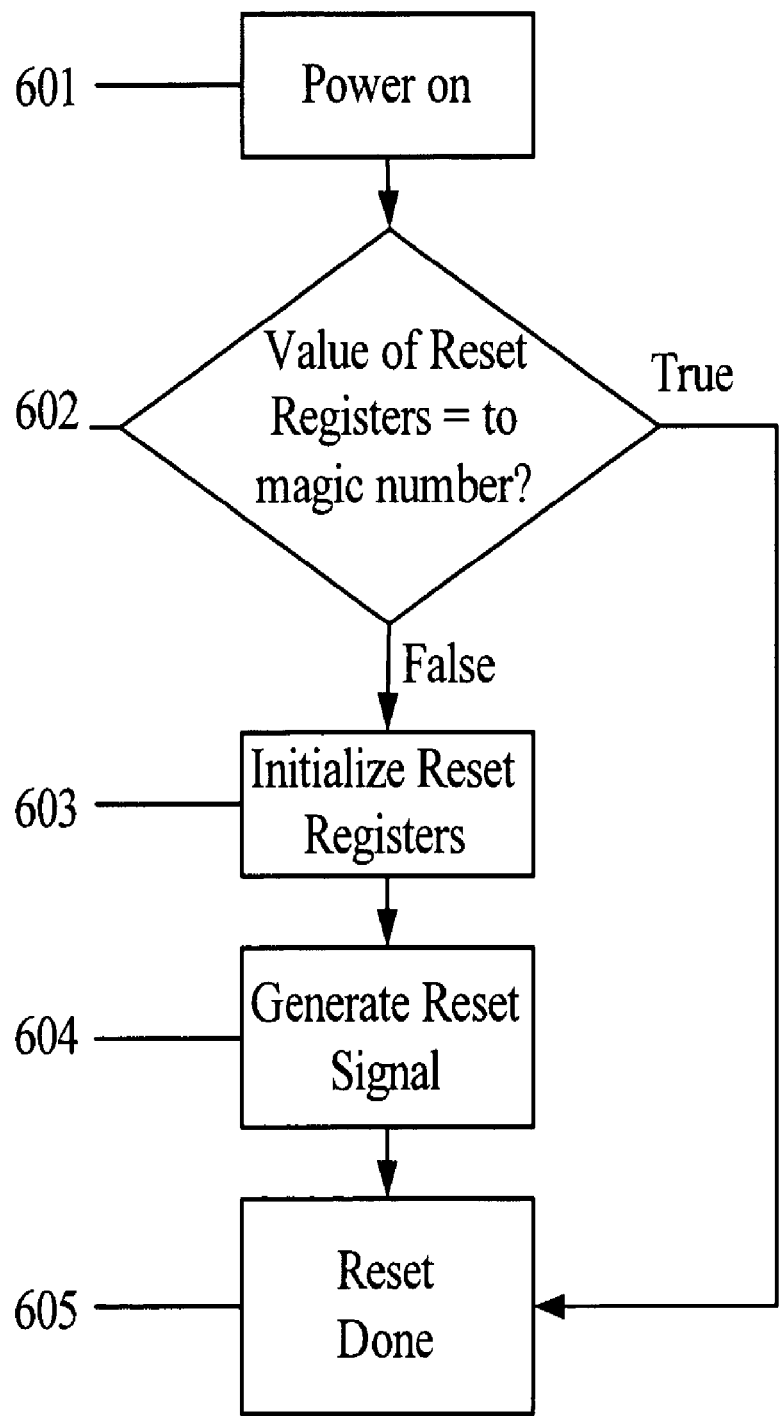
FIG. 6 illustrates a process of performing a power-on reset, according to one embodiment of the present invention.

The process is also illustrated in FIG. 6. In step 601, the power-on event commences. In step 602, the values of the reset registers are compared with a magic number. If the magic number and the register values are the same, then the process ends, since there is no need for the reset signal to be generated. When the register values do not match the magic number, the reset registers are initialized, step 603, and the reset signal is generated, in step 604. Thereafter, the reset process is finished, in step 605.

After the whole reset cycle is done, the value of the reset registers is equal to the magic number now. Thus, the reset signal generation event need not happen again. Only one reset event happens after power-on.

The present invention, according to certain embodiments, has a set of reset registers and a magic number. If the reset registers are composed of n registers, then after power-on, the probability of the reset registers value come out to be the magic number is 1/(2n). The greater the number of reset registers, the lower the probability that a false match could occur and result in an increased correctness of the approach.

The choice of magic number is also important. If all zeros or all ones were chosen as the magic number, then the reset registers with same physical characteristic may come out the value of all zeros or all ones. If the value with zeros and ones mixed is selected, the likelihood of false positive is reduced. The safest number is half of the bits are all zeros, and the other is all ones, like 0x55 or 0xAA. It is rare for the reset registers to come out to such values after power-on.

According to most embodiments, only a series of registers and simple circuit are needed. The effort for implementation is simple when compared to many other application circuits. And since the circuit is digital, it may be easily integrated into digital chips.

Figure 7:
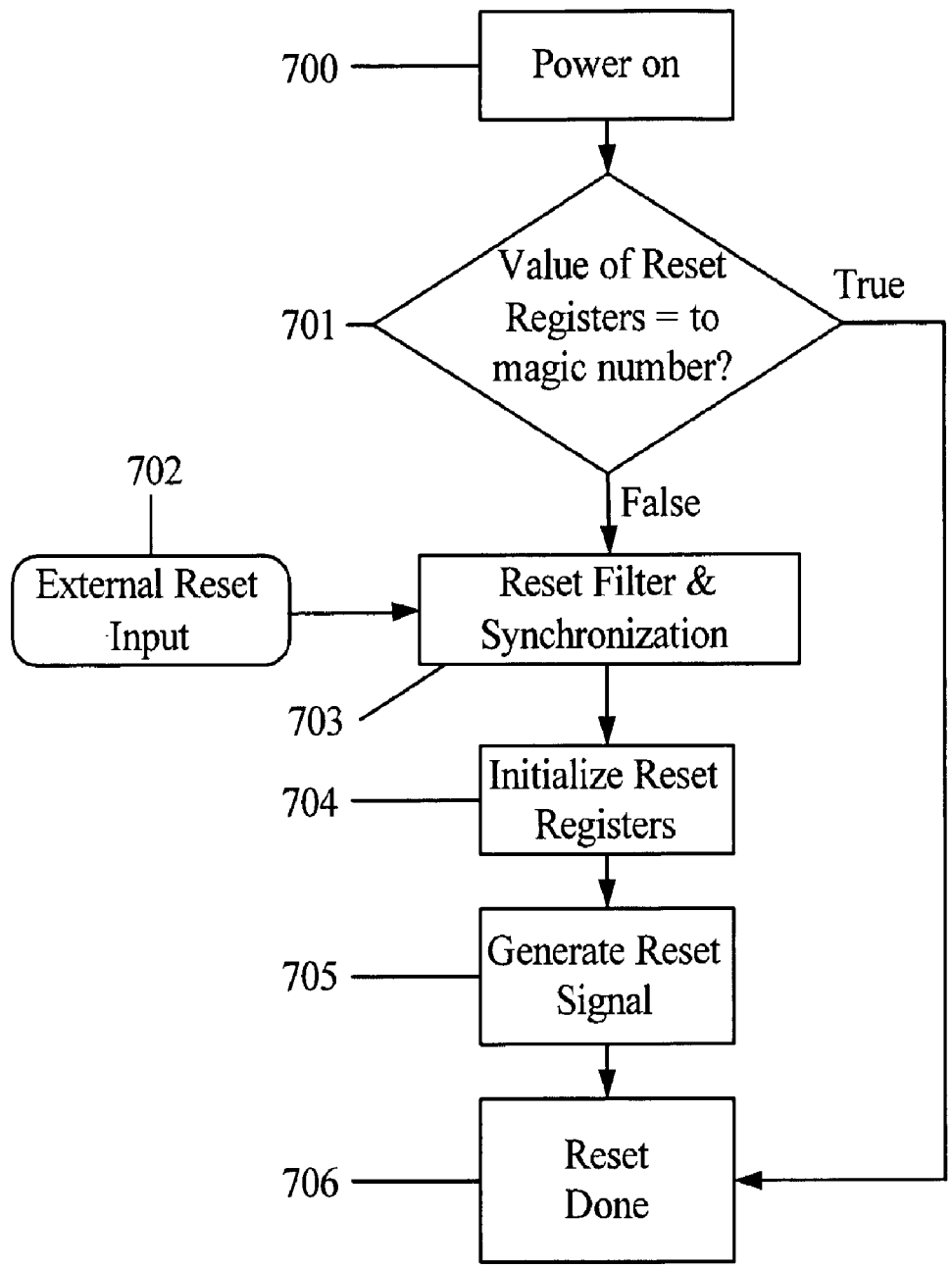
FIG. 7 illustrates a process of performing a power-on reset, according to an alternate embodiment of the present invention.

One problem can arise if there is also a need for a manual reset from the system. In that case, an external pin to indicate the situation may be necessary. As illustrated in FIG. 7, and alternate process is implemented to comport with the use of an external pin. The steps from the process of FIG. 6 remain the same, i.e., steps 601-605 are implemented as steps 700, 701, 704, 705 and 706, respectively. A step 703 is added to reset the filter and a synchronization to perform the desired function. The process flow is the same and the power-on reset task is processed as usual. However, in step 703, it is determined whether a signal from an external reset input, 702, to decide whether to manual reset the system or not.

During power-on, no matter whether the input from the external reset input 702 is zero or one, the power-on reset circuit will perform its function. After reset, once the external reset input is asserted, the reset circuit will be activated again.

The reset filter and synchronization step 703 also performs a reset filtering function to filter the glitch input from external reset input 702, and synchronize the phase to system clock domain. This is important to avoid the issues associated with the analog systems discussed above.

In summary, the digital power-on reset controller of the present invention provides a low cost way of generating the power-on reset signal. It is easy to implement and can be an embedded circuit for most chips that need the function. In addition, the input reset pin can be removed when there is no need for an external reset. Moreover, the signal quality of the rest signal is fully digital and less prone to glitches.

The above-discussed configuration of the invention is, in a preferred embodiment, embodied on a semiconductor substrate, such as silicon, with appropriate semiconductor manufacturing techniques and based upon a circuit layout which would, based upon the embodiments discussed above, be apparent to those skilled in the art. A person of skill in the art with respect to semiconductor design and manufacturing would be able to implement the various modules, interfaces, and tables, buffers, etc. of the present invention onto a single semiconductor substrate, based upon the architectural description discussed above. It would also be within the scope of the invention to implement the disclosed elements of the invention in discrete electronic components, thereby taking advantage of the functional aspects of the invention without maximizing the advantages through the use of a single semiconductor substrate.

With respect to the present invention, the devices discussed herein may be any electronic device that utilizes a power-on reset. These devices may also include network devices and can include switches, routers, bridges, gateways or servers.

The foregoing description has been directed to specific embodiments of this invention. It will be apparent, however, that other variations and modifications may be made to the described embodiments, with the attainment of some or all of their advantages. Therefore, it is the object of the appended claims to cover all such variations and modifications as come within the true spirit and scope of the invention.

What is claimed is:

1. A digital power-on reset circuit for an electronic device, the digital power-on reset circuit comprising:
 a reset memory element; and
 a comparator circuit configured to:
  during a power-on event, compare a value stored in the reset memory element with a predetermined value, and
  generate, in response to the power-on event, a reset signal when the value stored in the reset memory element does not match the predetermined value, and
 maintain the reset signal for a predetermined period of time.

2. The digital power-on reset circuit of claim 1, wherein the comparator circuit is configured to:
 in response to generating the reset signal, initialize the value stored in the memory element to the at least one predetermined value.

3. The digital power-on reset circuit of claim 1, wherein the comparator further comprises a counter, and wherein the comparator is configured to wait until the counter has reached a predetermined value before ceasing to generate the reset signal.

4. The digital power-on reset circuit of claim 1, wherein the power-on event includes a period of time in which electrical power is initially applied to the electronic device.

5. The digital power-on reset circuit of claim 1, wherein the comparator circuit further comprises:
 an input configured to receive an external reset input signal; and
 an output configured to send an additional reset signal based, at least in part, upon the external reset input signal.

6. The digital power-on reset circuit of claim 5, wherein the digital power-on reset circuit is configured to filter the external reset input signal.

7. The digital power-on reset circuit of claim 5, wherein the comparator circuit is configured to synchronize the external reset input signal with a system clock.

8. A method of resetting an electrical device comprising:
 determining an occurrence of a power-on event;

comparing a value stored in a reset memory element with a predetermined value;

generating a reset signal when the predetermined value is not equal to the value stored in the reset memory element; and maintaining the reset signal for a predetermined period of time.

9. The method of claim 8, further comprising:

initializing the value stored in the reset memory element to the predetermined value before the generating the reset signal.

10. The method of claim 8, wherein generating the reset signal includes incrementing a counter; and wherein maintaining the reset signal for a predetermined period of time includes waiting until the counter equals a predetermined threshold value before ceasing the generation of the reset signal.

11. The method of claim 8, wherein determining an occurrence of a power-on event includes detecting an initial application of electrical power to the electrical device.

12. The method of claim 8, further comprising:

receiving an external reset input signal; and transmitting an additional reset signal based, at least in part, upon the external reset input signal.

13. The method of claim 12, further comprising filtering the external reset input signal.

14. The method of claim 12, further comprising synchronizing the external reset input signal with a system clock.

15. A digital reset circuit for an electronic device, the digital reset comprising:

a determining means for determining an occurrence of a resettable event;

a comparing means for comparing a value stored in a memory element to a predetermined value; and a generating means for, when the predetermined value is not equal to the value stored in the memory element and in response to the resettable event, generating a reset signal for a predetermined period of time.

16. The digital reset circuit of claim 15, further comprising:

an initializing means for initializing the value stored in the memory element to the predetermined value in conjunction with generating the reset signal.

17. The digital reset circuit of claim 15, further comprising:

a counting means for determining when the predetermined period of time has elapsed.

18. The digital reset circuit of claim 15, wherein the resettable event includes an initial application of electrical power to the electrical device.

19. The digital reset circuit of claim 15, further comprising:

a receiving means for receiving an external reset input signal; and a filtering means for filtering the external reset input signal.

20. The digital reset circuit of claim 15, further comprising:

a receiving means for receiving an external reset input signal; and a synchronizing means for synchronizing the external reset input signal with a system clock.

* * * * *